United States Patent [19]

Inn

[11] Patent Number: 5,455,449
[45] Date of Patent: Oct. 3, 1995

[54] OFFSET LATTICE BIPOLAR TRANSISTOR ARCHITECTURE

[75] Inventor: Bruce L. Inn, Mountain View, Calif.

[73] Assignee: National Semiconductor Corporation, Santa Clara, Calif.

[21] Appl. No.: 268,802

[22] Filed: Jun. 30, 1994

[51] Int. Cl.[6] .................... H01L 27/082; H01L 29/00; H01L 29/70; H01L 31/11
[52] U.S. Cl. .................... 257/578; 257/563; 257/564; 257/579; 257/592; 257/593
[58] Field of Search ........................ 257/563, 564, 257/578, 579, 592, 593

[56] References Cited

U.S. PATENT DOCUMENTS 5,003,370  3/1991  Kashiwagi ........................ 257/578

OTHER PUBLICATIONS

J. G. Kassakian, M. F. Schlect & G. C. Verghese, "Section 18.8 Emitter–Current Focusing during Turn–Off," *Principles of Power Electronics*, pp. 521–522, Reading, Mass.: Addison–Wesley (1991).

F. Goodenough, "Tiny IC Plus FET Builds 'Super LDO' Regulator," *Electronic Design*, Mar. 7, 1994, pp. 45–49.

C. Simpson, "Understanding Three–Terminal Regulators," *Electronic Design*, Jan. 21, 1993, pp. 77–80.

*Primary Examiner*—Steven H. Loke
*Attorney, Agent, or Firm*—Limbach & Limbach

[57] ABSTRACT

An architecture for producing multiple emitter vertical bipolar transistors which substantially eliminates the starved regions found in the standard lattice architecture. An "offset lattice" design is described in which the base contact segments in adjacent stripes are shifted or offset relative to each other. This causes the emitter pieces which are added to connect adjacent emitter stripes to be staggered with respect to each other. As a result, all sections of the emitters face a base contact and the resistance encountered along a current path between a base contact and an emitter is reduced. This results in a vertical bipolar transistor having a larger proportion of highly activated emitter, better high-frequency performance, and a reduction in thermal noise owing to transistor base resistance.

8 Claims, 2 Drawing Sheets

1

OFFSET LATTICE BIPOLAR TRANSISTOR ARCHITECTURE

FIELD OF THE INVENTION

The present invention relates to the design and fabrication of vertical bipolar transistors, and more specifically, to an architecture for a bipolar transistor which produces a device having a reduced total collector resistance and can be operated in the non-saturated, i.e., linear, regime at low collector-emitter output voltages.

BACKGROUND OF THE INVENTION

The "common-emitter" connection scheme, which has a base-to-emitter input and a collector-to-emitter output, is the most frequently used means of connecting a bipolar transistor into a circuit. This is primarily because the power gain of the common-emitter connection is the highest of the most commonly used connection schemes.

It is often desirable to operate a transistor with sufficient collector-emitter voltage to keep the device in the so-called "non-saturated" region of operation, so that the transistor has current gain between its base-emitter input circuit and its collector-emitter output circuit. If the transistor is biased in this manner, the device can serve as an amplifier or a power-controlling pass device in a regulator. These modes of operation are important and are two of the chief roles for a transistor. If, on the other hand, the transistor is operating in the saturated regime, the device has low gain; as a consequence, the transistor cannot amplify an input signal. It also cannot be used as a power-controlling pass device in a regulator. This is because in order for a regulator to be energy-efficient, the control circuitry driving the pass device must consume less power than is being controlled by the pass device.

An example of a transistor which is designed to operate in the above-described mode is one in a low dropout regulator (LDO), which by definition must be able to provide regulation at low values of the voltage differential between the transistor input and output. This is a desirable feature because the lower the voltage drop across the regulator, the less power "burned" by the regulator, and the higher the efficiency of the overall circuit.

This performance specification imposes certain requirements on the pass transistor used in such regulators. Because the pass device has it collector connected to the output and its emitter connected to the input, the pass device's collector-emitter voltage equals the regulator's input-output voltage; therefore, in order for a LDO regulator to operate at a low input-output voltage differential, the pass device must be able to operate in the non-saturated region at low values of the collector-emitter voltage.

If the collector-emitter voltage of a transistor is small, say, around 1 volt or so (as is often the case for the pass device in an LDO), then the voltage drop due to the collector-emitter resistance may be sufficient to cause the collector voltage at the base-collector interface to be low enough that the base-collector junction is forward biased. This causes the transistor to operate in the saturated region, thereby cutting the current gain (referred to as beta) to a value so low that the base current used to modulate the flow of power out the collector rivals the current being delivered to the load. In such a situation, the transistor is not suitable as a power-controlling device.

This problem provides the motivation for finding ways to reduce the total collector resistance. If successful, this would permit a transistor to be made which operates in the non-saturated region at lower values of the collector-emitter voltage. Such a transistor can be used to make a regulator that operates at a much smaller input-output voltage differential.

FIG. 1 shows a cross-section view of a typical vertical npn bipolar transistor 10. By "vertical" is meant a bipolar transistor having an architecture such that the emitter emits current downward, in a direction perpendicular to the surface of the silicon body of the transistor. Bipolar transistors in which the emitter emits current horizontally, i.e., in a direction parallel to the surface of the silicon body are termed "lateral".

As shown in FIG. 1, bipolar transistor 10 includes a silicon substrate 11 and collector region 19. Below collector region 19 lies a buried layer 14. Collector contact 20 is formed in collector region 19 and over buried layer 14. Base region 12 is formed in collector region 19. Base contact 16 and emitter 18 are formed in base region 12. When transistor 10 is connected in the common-emitter mode, current 15 flows from emitter 18 downward into buried layer 14, laterally along buried layer 14, and upward to collector contact 20.

A typical bipolar transistor manufacturing process, such as one used to manufacture a npn vertical transistor of the type shown in FIG. 1, will now be described. The manufacturing process described is intended for purposes of illustration only, as the present invention is applicable to the layout of any vertical bipolar device, i.e., pnp or npn. In each of the described process steps, the regions of the device which are being operated on are defined by well-known photolithographic techniques used in the semiconductor industry.

In the first step, an n-type dopant is implanted into substrate 11 to form buried layer 14. N-type epitaxial silicon is then grown on top of substrate 11, forming collector region 19. A p-type dopant is then implanted into collector region 19 to form base region 12. This is followed by the implantation of an n-type dopant at a high concentration to form emitter 18 and collector contact 20, and the implantation of a p+ dopant to form base contact 16.

As is well known, and as shown in FIG. 2, the total collector resistance of a bipolar transistor 10 such as that shown in FIG. 1 is equal to the sum of the "down" resistance 30 from emitter 18 to buried layer 14, the resistance 32 of buried layer 14, and the "up" resistance 34 from buried layer 14 to collector contact 20. As previously noted, in order for a LDO regulator to operate at a low input-output voltage differential, the pass device must be able to operate in the non-saturated region at low values of the collector-emitter voltage. This provides the motivation for reducing the total collector resistance, and has stimulated efforts to design bipolar transistor architectures which reduce one or more of the components of the total collector resistance.

The "down" component 30 of the collector resistance can be reduced by enlarging the surface area of the emitter. This spreads out the current flow between the emitter and buried layer, thereby minimizing the voltage drop. An increase in the emitter contact area is usually achieved by arranging multiple emitters in the base region.

The buried layer resistance 32 can be reduced by designing the device so that the current path through the buried layer is broad. This is usually accomplished by increasing the transistor dimension which is perpendicular to the direction of flow of the buried layer current.

The "up" component 34 of the collector resistance can be reduced by increasing the area of the collector contact. This causes the current flowing up to the contact to have a large cross-sectional area so that it encounters little resistance. An increase in the collector contact area is usually achieved by placing additional collector contacts on opposing sides of the base region.

The result of implementing the standard approaches to reducing total collector resistance which are described above is a "conventional" architecture multiple emitter bipolar transistor 100, a top view of which is shown in FIG. 3. Multiple emitter bipolar transistor 100 has a base region 102 which lies over a buried layer 104. Multiple base contacts 106 and emitters 108 are formed in base region 102, typically in alternating parallel stripes. Collector contacts 110 are formed over buried layer 104.

While the conventional architecture shown in FIG. 3 incorporates design features intended to reduce the total collector resistance, it is not the optimal architecture. In particular, the emitter area (and hence its contribution to lowering the down resistance) is limited by the large amount of surface area occupied by the base contacts. If a greater proportion of the base region were covered by emitter instead of base contact, the down resistance component, and hence the total collector resistance, could be reduced even more.

In order to realize a proportionally larger emitter area, designers have modified the conventional layout scheme, and instead used what is termed a "lattice" layout scheme. FIG. 4 shows a top view of a multiple emitter bipolar transistor 200 which is laid out according to the lattice architecture. In the lattice design, a base region 202 again lies over a buried layer 204. As with the architecture of FIG. 3, base contacts 206 and multiple emitters 208 are formed in base region 202, and collector contacts 210 are formed over buried layer 204. However, in this design the emitter area is increased by creating gaps in, or segmenting base contacts 206, and filling the gaps with additional regions of emitter 208. The result is that each base contact 206 is bordered by horizontal 220 and vertical 230 sections of emitter 208. In this design, the total emitter area is increased, while the base contact area is decreased, leading to a significant increase in the ratio of emitter area to base area.

While the lattice design of FIG. 4 increases the emitter surface area, it still suffers from at least one important disadvantage. The drawback of this design is that the emitter regions now contain sections 240, formed at the intersection of the horizontal and vertical portions of the emitter, which do not face a base contact. These sections are referred to as "starved regions" and are indicated by asterisks "* " on FIG. 4. As starved regions 240 do not face a base contact, the resistance along a current path between these regions and a base contact is larger than for other regions of emitter 208. This is because the resistance of the base region underneath an emitter is orders of magnitude larger than that of the bulk base. Thus, a current flowing between a base contact and a starved region of the emitter encounters much higher resistance than one flowing between a base contact and other regions of the emitter.

The higher resistance attenuates the drive these regions receive from the base voltage applied to the base-to-emitter input of the transistor. This significantly alters the device's current driving capability, because the current emitted by an emitter-base junction is an exponential function of the voltage across the junction. For example, a relatively minor 18 mv reduction, amounting to only 0.3 percent of the applied voltage, can reduce emitter activity by a factor of two. An additional effect of the higher resistance along current paths between the base contact and starved regions of the emitter is that the "average" base resistance for a random current path is increased. This produces an increase in the thermal noise generated during the operation of the transistor as a result of the base resistance.

The existence of starved regions 240 means that not all of the emitter operates with 100 per cent efficiency. Thus, although a lattice design packs a greater amount of emitter surface area into a given base area, the design produces an emitter which is not as fully excited over its entire extent as is an emitter in the conventional design. Although the overall result may be an improvement over the conventional design, it is apparent that it is not optimal. The down component of the total collector resistance has been decreased, but at the cost of impacting the degree of activity of the added emitter regions and the resistance across the input.

What is desired is a design for a multiple emitter bipolar transistor which reduces the total collector resistance while avoiding the disadvantages of the lattice or other common architectures.

SUMMARY OF THE INVENTION

The present invention is directed to a modification of the standard lattice architecture used in fabricating multiple emitter bipolar transistors. In the present invention, the lattice structure is altered so that all emitter regions face at least one base contact. This is accomplished by adopting an "offset lattice" design in which the base contact segments in adjoining parallel stripes are shifted relative to each other. This causes the vertical emitter pieces which are added to connect adjoining parallel emitter stripes to be staggered with respect to each other. As a result, the starved regions of the emitter found in the standard lattice design are significantly reduced, thereby restoring substantially all of the emitter efficiency which was previously lost. This eliminates the primary disadvantage of the standard lattice design.

DETAILED DESCRIPTION OF THE PREFERRED EMBODIMENT

Figure 1:
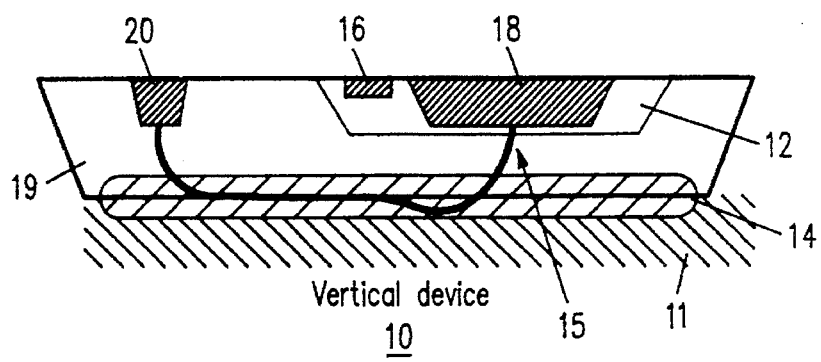
FIG. 1 shows a cross-section view of a typical vertical npn bipolar transistor.
Figure 2:
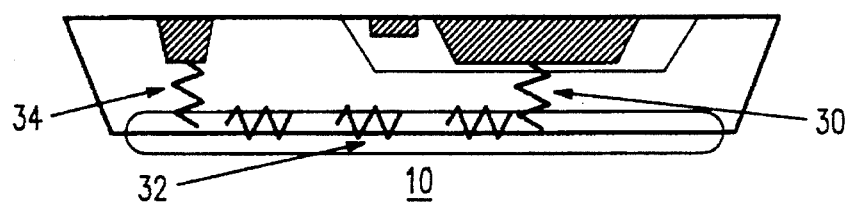
FIG. 2 illustrates the components of the total collector resistance for a bipolar transistor of the type shown in FIG. 1.
Figure 3:
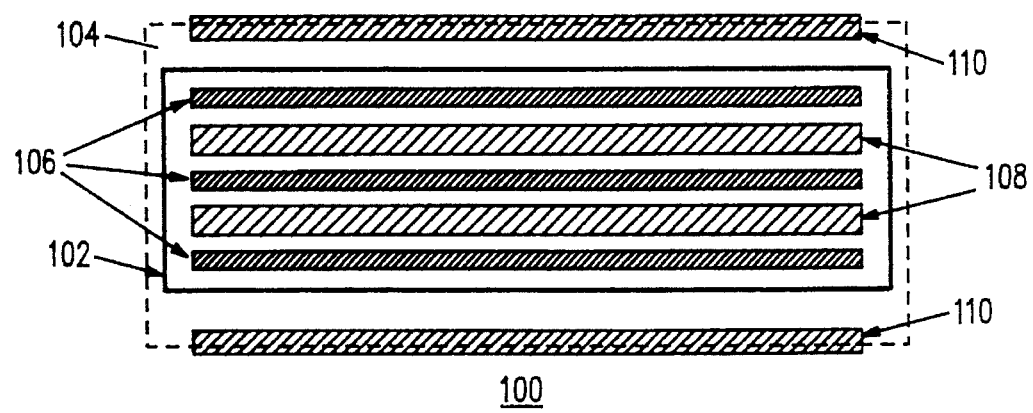
FIG. 3 shows a top view of a multiple emitter bipolar transistor which is laid out according to the "conventional" architecture.
Figure 4:
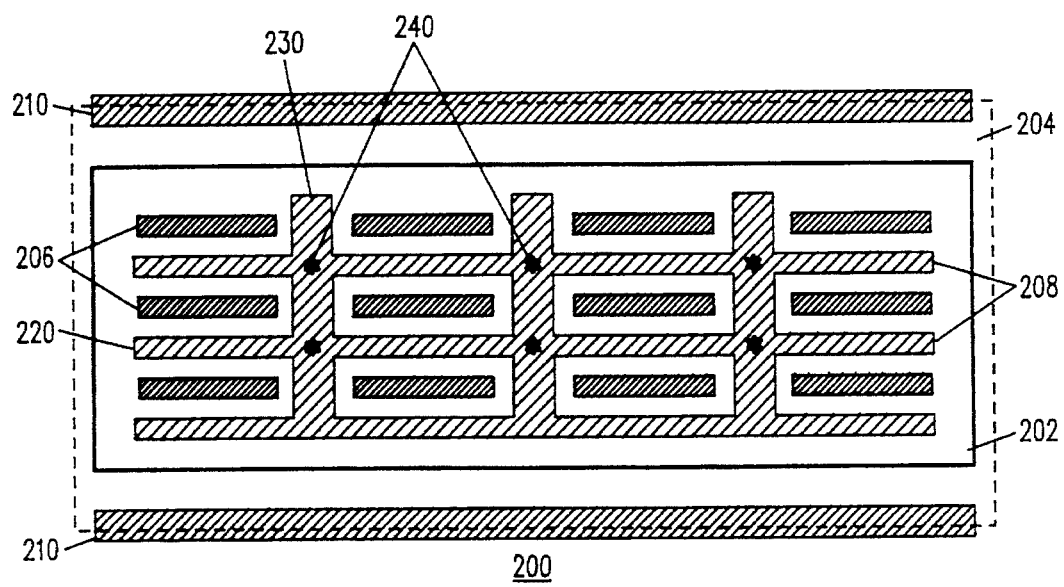
FIG. 4 shows a top view of a multiple emitter bipolar transistor which is laid out according to the "lattice" architecture.
Figure 5:
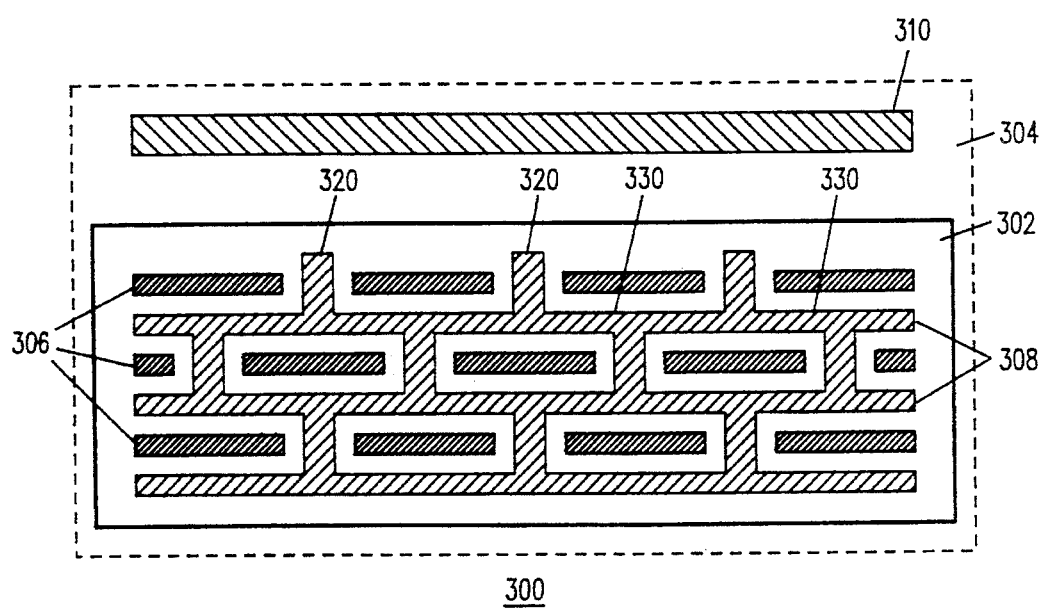
FIG. 5 shows a top view of a multiple emitter bipolar transistor which is laid out according to the "offset lattice" architecture of the present invention.

FIG. 5 shows a top view of a multiple emitter bipolar transistor 300 which is laid out according to the "offset lattice" architecture of the present invention. In the offset lattice design, transistor 300 has a base region 302, below which lies a buried layer 304. Base contacts 306 and multiple emitters 308 are formed in base region 302. Collector contact 310 is formed over buried layer 304. Although only one collector contact is illustrated in FIG. 5, one skilled in the art will recognize that multiple collector contacts may be used, as shown for example in FIG. 4.

As indicated by FIG. 5, base contact segments 306 in adjacent parallel stripes are staggered with respect to each other, with vertical emitter sections 320 being laid out in the intervening spaces. Owing to the staggering of base contacts 306, emitter sections 308 are similarly staggered. The result is an architecture in which each region of emitters 308 faces at least one base contact 306, with emitters 308 being composed of horizontal sections 330 which are parallel to base contacts 306 and vertical sections 320 which are perpendicular to base contacts 306. This effectively eliminates the starved regions present in the standard lattice architecture because the regions at which sections 320 and sections 330 intersect, which previously formed the starved regions in the lattice design, now face a base contact 306. Thus, the voltage drop between a base contact and the intersection of emitter sections 320 and 330 is reduced in magnitude from what it would be in the lattice design.

The offset lattice architecture of the present invention increases the proportion of highly excited emitter area relative to the standard lattice architecture, thereby lowering the down component of the total collector resistance. This design has the additional benefit of requiring less base area for a given active emitter area, i.e., the ratio of highly excited emitter area to base area is increased with respect to other architectures. This means that the parasitic base-collector capacitance will be lower for a transistor of a given emitter size which is constructed according to the design of the present invention. As a result, its high frequency performance will be improved, thereby providing benefits in medium-power and high frequency amplifier applications. The average resistance encountered for current paths between a base contact and an emitter region is also reduced, thereby reducing the thermal noise associated with transistor base resistance.

Although the emitter efficiency of this design is increased with respect to the lattice design, the magnitude of the increase varies, and depends upon the design elements which were primarily responsible for the inefficiency in the lattice design. As is known, the emitter starvation associated with the lattice design is a function of several factors, including: (1) the dimensions of the emitter stripes and added regions which create the lattice; (2) the junction depths of the emitter and base; (3) the ratio of the area of the added emitter regions to the area of the stripes; (4) the resistivities of the bulk base, the under emitter base region, and the collector; and (5) the spacing between the base contacts and emitter regions. The overall improvement achieved by the present invention in comparison to the standard lattice design will depend on the relative significance of each of these factors.

The manufacturing steps for a device constructed according to the offset lattice architecture of the present invention primarily differ from that of a conventional or lattice design bipolar transistor in the locations at which the base contacts and emitter regions are formed. This means that the photomasks used to define the regions in which dopants are implanted to form the base contacts and emitter regions must naturally be designed with this in mind. The other features of the process flow for a device constructed according to the offset lattice design are basically the same as for the conventional or lattice architectures. In general terms, the invention can be implemented on any bipolar process, including side by side processes used in producing non-offset lattice architecture devices.

To illustrate the benefits which can be derived from the offset lattice architecture of the present invention, the inventor has evaluated the quantitative improvements obtained for the case of fabricating a LDO regulator in a bipolar process. In the process used, vertical npn and pnp transistors are formed. The quantitative measurements were made for a pnp device which formed part of the regulator.

The table below shows base area (in square microns), active emitter area (in square microns), base packing coefficient, $\kappa_B$ (active emitter per unit base), and the per cent improvement in the base packing coefficient for the case of the conventional multiple emitter, lattice, and offset lattice architectures.

| Parameter | Conventional | Lattice | Offset Lattice |
| --- | --- | --- | --- |
| Base Area ($\mu^2$) | 137,000 | 137,000 | 137,000 |
| Active Emitter Area ($\mu^2$) | 29,840 | 58,250 | 62,180 |
| $\kappa_B$ % | 21.8 | 42.5 | 45.4 |
| $\kappa_B$ Improvement % | — | 95% | 108% |

As indicated by the above table, use of the offset lattice design results in an improvement of approximately 7% (45.4/42.5) in the base packing coefficient with respect to the standard lattice design.

For the device being considered in this example, the down component comprises approximately 50% of the total collector resistance. Therefore, as indicated by the table below, a given percentage improvement in the amount of emitter relative to base results in half as much improvement in the reduction of the total collector resistance, $R_C$.

| Parameter | Conventional | Lattice | Offset Lattice |
| --- | --- | --- | --- |
| Active Emitter Area ($\mu^2$) | 29,480 | 58,250 | 62,180 |
| $R_C$ (in ohms) | 3.38 | 2.68 | 2.5 |
| $R_C$ Improvement % | — | 21 | 26 |

As previously mentioned, because a given size of emitter can be packed into a smaller base region when the offset lattice architecture of the present invention is used, a device constructed according to this architecture will have a smaller value of the collector-base capacitance per unit emitter area. This provides improved performance for medium-power and high frequency amplifier applications.

In addition, if design considerations for a particular device require using a certain minimum emitter size (in order to keep emitter current density under a desired level), or if a given value of $P_c$ is called for, the device can be produced in a smaller layout area. The consequence of this benefit is that chip size is decreased and yield is increased.

A further benefit is that because the average resistance encountered along a current path between a base contact and an emitter is reduced, the thermal noise generated as a result of the base resistance is also reduced. This improves the signal-to-noise ratio and general operation of a transistor which embodies the present invention.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A bipolar transistor having an increased proportion of active emitter in a given base area, a reduced total collector resistance, and minimized emitter-to-base resistance, comprising:
   a set of base contacts arranged in a first and a second substantially parallel base contact stripe, the first and second base contact stripes being divided into base contact segments having intervening gaps, wherein the base contact segments in the first and second base contact stripes are offset from each other; and
   a set of emitter regions arranged in substantially parallel stripes, wherein adjacent emitter stripes are electrically connected by connecting pieces which are arranged in the gaps between the base contact segments in the first and second base contact stripes.

2. A bipolar transistor having an increased proportion of active emitter in a given base area, a reduced total collector resistance, and minimized emitter-to-base resistance, comprising:
   a buried layer of a first conductivity type;
   a base region of a second conductivity type arranged over the buried layer;
   a set of base contacts arranged in a first and a second substantially parallel base contact stripe on the base region, the first and second base contact stripes being divided into base contact segments having intervening gaps, wherein the base contact segments in the first and second base contact stripes are offset from each other;
   a set of emitter regions of the first conductivity type arranged in substantially parallel stripes on the base region, wherein adjacent emitter stripes are electrically connected by connecting pieces which are arranged in the gaps between the base contact segments in the first and second base contact stripes; and
   a collector contact arranged over the buried layer, wherein the collector contact is not in contact with the base region.

3. The bipolar transistor of claim 2, wherein the first conductivity type is p-type conductivity and the second conductivity type is n-type conductivity.

4. The bipolar transistor of claim 2, wherein the first conductivity type is n-type conductivity and the second conductivity type is p-type conductivity.

5. A bipolar transistor having an increased proportion of active emitter in a given base area, a reduced total collector resistance, and minimized emitter-to-base resistance, comprising:
   a set of base contacts arranged in a first and a second substantially parallel base contact stripes, the first and second base contact stripes being divided into base contact segments having intervening gaps, wherein the base contact segments in the first and second base contact stripes are offset from each other; and
   a single emitter stripe, the single emitter stripe having emitter pieces perpendicular to and extending from the emitter stripe, with the emitter pieces arranged in the gaps between the base contact segments in the first and second base contact stripes.

6. A bipolar transistor having an increased proportion of active emitter in a given base area, a reduced total collector resistance, and minimized emitter-to-base resistance, comprising:
   a buried layer of a first conductivity type;
   a base region of a second conductivity type arranged over the buried layer;
   a set of base contacts arranged in a first and a second substantially parallel base contact stripes on the base region, the first and second base contact stripes being divided into base contact segments having intervening gaps, wherein the base contact segments in the first and second base contact stripes are offset from each other; and
   a single emitter stripe, the single emitter stripe having emitter pieces perpendicular to and extending from the emitter stripe, with the emitter pieces arranged in the gaps between the base contact segments in the first and second base contact stripes.

7. The bipolar transistor of claim 6, wherein the first conductivity type is p-type conductivity and the second conductivity type is n-type conductivity.

8. The bipolar transistor of claim 6, wherein the first conductivity type is n-type conductivity and the second conductivity type is p-type conductivity.

* * * * *